United States Patent
Endo et al.

(10) Patent No.: US 7,442,623 B2
(45) Date of Patent: Oct. 28, 2008

(54) METHOD FOR MANUFACTURING BONDED SUBSTRATE AND BONDED SUBSTRATE MANUFACTURED BY THE METHOD

(75) Inventors: Akihiko Endo, Tokyo (JP); Tatsumi Kusaba, Tokyo (JP)

(73) Assignee: Sumco Corporation, Tokyo (JP)

( * ) Notice: Subject to any disclaimer, the term of this patent is extended or adjusted under 35 U.S.C. 154(b) by 207 days.

(21) Appl. No.: 11/562,162

(22) Filed: Nov. 21, 2006

(65) Prior Publication Data
US 2007/0117281 A1    May 24, 2007

(30) Foreign Application Priority Data
Nov. 21, 2005    (JP) ............................. 2005-335118

(51) Int. Cl.
   *H01L 21/44*   (2006.01)
(52) U.S. Cl. .................... 438/455; 438/458; 438/459; 257/E21.212; 257/E21.088; 257/E21.143; 257/E21.568; 257/E21.601
(58) Field of Classification Search ................ 438/455, 438/458, 459, 507, 67, 706; 257/E21.057, 257/E21.088, E21.143, E21.212, E21.215, 257/E21.335, E21.568, E21.601
See application file for complete search history.

(56) References Cited

U.S. PATENT DOCUMENTS

| 6,048,411 | A  | * | 4/2000  | Henley et al. | 148/33.5 |
| 6,159,824 | A  | * | 12/2000 | Henley et al. | 438/455 |
| 6,323,108 | B1 | * | 11/2001 | Kub et al.    | 438/458 |
| 6,352,909 | B1 | * | 3/2002  | Usenko        | 438/458 |
| 6,500,732 | B1 | * | 12/2002 | Henley et al. | 438/459 |
| 6,540,827 | B1 | * | 4/2003  | Levy et al.   | 117/3   |
| 6,558,802 | B1 | * | 5/2003  | Henley et al. | 428/446 |
| 6,602,767 | B2 | * | 8/2003  | Nishida et al.| 438/507 |

\* cited by examiner

*Primary Examiner*—Michael S Lebentritt
(74) *Attorney, Agent, or Firm*—Duane Morris LLP

(57) ABSTRACT

A high quality bonded substrate is obtained in which generation of microprotrusions and cracked particles are restricted on a surface of an active layer of the bonded substrate and the surface of the active layer is flattened. A laminated body is formed by overlapping a first semiconductor substrate serving as an active layer onto a second semiconductor substrate serving as a support substrate via an oxide film or without an oxide film; the active layer is formed by forming a thin film from the first semiconductor substrate; and the surface of the active layer is flattened by vapor-phase etching. After forming a thin film from the first semiconductor substrate and before flattening the surface of the active layer by the vapor-phase etching, an organic substance adhering to the surface of the active layer is removed and a native oxide film generated on the surface of the active layer is removed after removing the organic substance.

13 Claims, 4 Drawing Sheets

US 7,442,623 B2

METHOD FOR MANUFACTURING BONDED SUBSTRATE AND BONDED SUBSTRATE MANUFACTURED BY THE METHOD

BACKGROUND OF THE INVENTION

1. Field of the Invention

The present invention relates to a method for manufacturing a bonded substrate by bonding a first semiconductor substrate onto a second semiconductor substrate via an oxide film therebetween, or without the oxide film therebetween. More in detail, the present invention relates to a method suitable for manufacturing an SOI (Silicon on Insulator) substrate when a silicon substrate is used for a semiconductor substrate.

2. Description of the Related Art

Conventionally, as a method for manufacturing a bonded substrate, there has been known a method for manufacturing a bonded substrate which uses a bonding method in which the first silicon substrate serving as an SOI layer is contacted closely onto a second silicon substrate serving as a support substrate via an oxide layer. In the methods for manufacturing the bonded substrate, there are an ion implantation separation method which is also called a smart-cut method; and a GB method (Grind Back), etc.

The above ion implantation separation method is a manufacturing method for obtaining the SOI substrate in which the SOI layer is formed on the second silicon substrate via the oxide film by forming a laminated body by bonding the first silicon substrate into which hydrogen ions or rare gas ions are implanted onto the second silicon substrate via the oxide film; by maintaining this laminated body in a thermal treatment furnace at a predetermined temperature; and separating the first silicon substrate in an ion implantation area.

On the other hand, the GB method is a manufacturing method for obtaining the SOI substrate in which the SOI layer is formed on the second silicon substrate via the oxide film by forming the laminated body by bonding the first silicon substrate onto the second silicon substrate via the oxide film; and forming a thin film by grinding the first silicon substrate from a primary surface of the first silicon substrate which does not contact the second silicon substrate after bonding the laminated body by thermal treatment.

However, in the SOI substrate manufactured by the above ion implantation separation method, surface roughness of the SOI layer which is a cleavage surface increases; therefore there has been a problem that crystal defect layer exists in an upper portion of the SOI layer due to the separation. Also, in the SOI substrate manufactured by the above GB method, there has been a problem that an innersurface film thickness is uneven in an entire SOI layer.

In order to solve these problems, there is disclosed a method for manufacturing the SOI substrate using a vapor-phase etching method which is called a PACE method (Plasma Assisted Chemical Etching) (for example, refer to Patent Reference 1).

The PACE method disclosed by the above patent reference is a method which is provided with a pair of electrodes disposed upwardly and downwardly so as to sandwich the SOI substrate; a high-frequency power supply for applying high frequency wave between these electrodes; and a cavity disposed to one of the electrodes so as to face the SOI substrate and to freely run on the SOI substrate where plasma localized in the cavity etches the SOI layer by this plasma. In order to etch the SOI layer by using this PACE method, thickness distribution of the SOI layer on the SOI substrate is measured at first, next the running speed of the cavity is controlled in accordance with this thickness distribution. This enables time to be controlled during which the SOI layer is exposed to the plasma; therefore, it is possible to form the thickness of the SOI layer uniformly while the crystal defect layer on the surface of the SOI layer is removed.

[Patent Reference 1] Japanese Unexamined Patent Application, First Publication No. H11-102848 (claim 1, paragraph [0016], paragraph [0021], paragraph [0030], FIG. 2))

SUMMARY OF THE INVENTION

In the conventional method for manufacturing the SOI substrate shown in the above patent reference, it is necessary to carry out a hydrogen fluoride cleaning as a previous process to the above vapor-phase etching process because reactive gas, such as $SF_6$, $CF_4$, $H_2$, etc. used in the vapor-phase etching treatment or inert gas, such as Ar cannot etch a native oxide film ($SiO_2$ film) even if it has very thin thickness of, e.g., 1 to 3 nm.

However, there has been a deficiency in that microprotrusions occur on the surface of the SOI layer even if the vapor-phase etching treatment is carried out after this hydrogen fluoride cleaning. If these microprotrusions are observed by an AFM (Atomic Force Microscope), approximately $1 \times 10^6$ to $1 \times 10^7$ pieces/cm$^2$ exist. There is an example shown in FIG. 4. Specifically, as shown in FIGS. 3(a) to (d), it is anticipated that, after the laminated body is formed by bonding the first silicon substrate onto the second silicon substrate via the oxide film and an active layer is formed by forming a thin film from the first silicon substrate; as shown in FIGS. 3(e) to (g), an organic substance adhering onto a surface of an SOI layer 1b serves as a mask during the removal of a native oxide film by the hydrogen fluoride cleaning; the native oxide film remains on a part to which the organic substance adheres; this partial native oxide film serves as a mask during etching the SOI layer in the vapor-phase etching; thus, the SOI layer in the fine portion covered with the above organic substance and the native oxide film is not etched, i.e., remains there; thus, the organic substance becomes the protrusions. Although these microprotrusions are small in that the height is 5 to 100 nm and the size is approximately 0.1 to 1 µm, there has been a problem which is not ignorable because the thickness of the SOI layer is 0.1 µm or less in a thin film SOI substrate.

In order to lower these microprotrusions, although methods can be proposed in which the hydrogen fluoride cleaning time is extended (for example, for 30 minutes), or highly dense hydrogen fluoride aqueous solution (for example, density is 50%) is used, there has been a concern in these methods that particles are generated (hereinafter, referred to as cracked particles) because a buried oxide film exposed on a peripheral surface of the SOI substrate dissolves; and the peripheral portion of the SOI layer becomes like a shelter; and the shelter-like portion of the SOI layer cracks and adheres to the surface of the SOI layer in the following such as thermal treatment, etc.

It is an object of the present invention to provide a method for manufacturing a bonded substrate and the bonded substrate manufactured by the method in which high quality bonded substrate is obtained by restricting the generation of the microprotrusions and the cracked particles on the surface of the active layer and flattening the surface of the active layer.

Means for Solving the Problems

As shown in FIG. 1, the invention according to claim 1 is an improved method of a method for manufacturing a bonded substrate in which, after forming a laminated body 13 by overlapping the first semiconductor substrate 11 serving as an active layer onto the second semiconductor substrate 12 serving as a support substrate via an oxide film 11a, or without the oxide film 11a although it is not shown in the drawing, a thin film is formed from this first semiconductor substrate 11 to form the active layer 11b; and furthermore the surface of the active layer 11b is flattened by the vapor-phase etching.

Its characteristic configuration exists in that the method further comprises the steps of, after the first semiconductor substrate 11 is formed to be a thin film and before flattening the surface of the active layer 11b by the vapor-phase etching, removing the organic substance 14 adhering onto the surface of the active layer 11b; and removing the native oxide film 15 generated on the surface of the active layer 11b after removing the organic substance 14.

In the bonded substrate recited in claim 1, the organic substance 14 interspersing on the native oxide film 15 is removed before the native oxide film 15, formed on the surface of the active layer 11b, which has been a mask for the vapor-phase etching gas is removed. Thus, since the organic substance 14 does not become a mask during removing the native oxide film; and the native oxide film 15 on the surface of the active layer 11b can be removed fully approximately; therefore, the surface of the active layer 11b can be flattened without generating the microprotrusions on the surface of the active layer 11b during the vapor-phase etching.

The invention according to claim 2, relating to the invention according to claim 1, is a method for manufacturing the bonded substrate in which, further as shown in FIG. 1, the organic substance 14 is removed by cleaning using dissolved ozone water, sulfuric acid, plasma of oxygen gas, or radical of oxygen gas.

In this method for manufacturing the bonded substrate recited in claim 2, the organic substance 14 dissolves into $CO_2$, $H_2O$, $O_2$ and residue due to oxidizing and dissolving effect of the organic substance by ozone; thus, approximately all of the organic substance vaporizes because, if the dissolved ozone water is used for removing the organic substance 14 adhering to the surface of the active layer 11b, the organic substance 14 which is a compound having double bond (C=C) of the carbon atom or triple bond (C≡C) of carbon atom contacts ozone $O_3$ having property of an oxidant solving in the dissolved ozone water.

Also, if sulfuric acid is used for removing organic substance 14, since the organic substance 14 contacts the sulfuric acid solving in the diluted sulfuric acid; the organic substance 14 dissolves into $CO_2$, $H_2O$, $O_2$ and residue due to oxidizing and dissolving effect of the organic substance by sulfuric acid; thus, approximately all of the organic substance vaporizes.

Also, if plasma of oxygen gas is used for removing the organic substance 14, electron ion in the plasma of the oxygen gas is accelerated due to a difference between a plasma potential and a floating potential, this electron ion collides the organic substance 14 adhering to the surface of the active layer 11b; thus, the organic substance 14 physically dissolves.

Furthermore, if the radical of the oxygen gas is used for removing organic substance 14, since the organic substance 14 contacts the radical which is a neutral ion of the oxygen gas; the organic substance 14 dissolves into $CO_2$, $H_2O$, $O_2$ and residual due to oxidizing and dissolving effect of the organic substance by the radical of the oxygen gas; thus, approximately all of the organic substance vaporizes.

Since approximately all of the organic substance 14 adhering to the surface of the active layer 11b is removed by the above method, in the following step of removing the native oxide film 15, the native oxide film 15 does not remain to intersperse on the surface of the surface of the active layer 11b; therefore, it is possible to restrict the generation of the microprotrusions.

The invention according to claim 3, relating to the invention according to claim 1, is a method for manufacturing the bonded substrate, further as shown in FIG. 1, in which the removal of the native oxide film 15 is carried out by cleaning while the surface of the active layer 11b is contacted to the hydrofluoric acid aqueous solution having 0.5 to 10% density for 0.5 to 10 minutes.

In the method recited in claim 3 for manufacturing the bonded substrate, since the bonded substrate 10 is cleaned by hydrogen fluoride in order to remove the native oxide film 15 generated on the surface of the active layer 11b after removing the organic substance 14, the native oxide film ($SiO_2$ film) 15 on the surface of the active layer 11b reacts with the hydrofluoric acid (HF) and becomes $H_2O$ and $SiF_4$; approximately all of the native oxide film 15 on the surface of the active layer 11b vaporizes. By this, since there is no portion that masks the etching gas in the following vapor-phase etching, it is possible to restrict the generation of the microprotrusions.

The invention according to claim 4, relating to the invention according to claim 1, is a method for manufacturing the bonded substrate in which the flattening of the surface of the active layer 11b using the vapor-phase etching is carried out by using plasma or radical of the reactive gas of $SF_6$ or $CF_4$, or plasma of mixture gas of Ar and $H_2$, mixture gas of $CF_4$ and $O_2$, or single gas of $O_2$.

In the method for manufacturing the bonded substrate recited in this claim 4, if the vapor-phase etching is carried out by using the above plasma, etc., as an etchant, the surface of the active layer 11b can be flattened by the effect.

The invention according to claim 5, relating to the invention according to claim 1, is characterized in that, as further shown in FIG. 1, the formation of the active layer 11b by forming a thin film from the first semiconductor substrate 11 is carried out by, after forming the ion implantation area 11c in this first semiconductor substrate 11 by implanting ions into the first semiconductor substrate 11 on which the oxide film 11a is formed, the laminated body 13 is formed by overlapping the first semiconductor substrate 11 onto the second semiconductor substrate 12 via the oxide film 11a, and furthermore, this laminated body 13 is separated in the ion implantation area 11c.

In this method for manufacturing the bonded substrate recited in claim 5, although static electricity is generated when the laminated body 13 is separated in the ion implantation area 11c and the floating organic substance 14 adheres onto the surface of the active layer 11b due to this static electricity, since approximately the entire organic substance 14 is removed in the step of removing the organic substance, the native oxide film 15 does not remain to intersperse on the surface of the active layer 11b removing the native oxide film. Thus, it is possible to restrict the generation of the microprotrusions on the surface of the active layer 11b.

The invention according to claim 6, relating to the invention according to claim 1, is characterized in that, as further shown in FIG. 2, the formation of the active layer 11b by forming a thin film from the first semiconductor substrate 11 is carried out by, after forming the laminated body 13 by overlapping the first semiconductor substrate 11 onto the second semiconductor substrate 12 via the oxide film 11a and this laminated body 13 is thermally treated and bonded, the first semiconductor substrate is ground to a predetermined thickness.

In this method for manufacturing the bonded substrate recited in claim 6, although the floating organic substance 14 adheres onto the surface of the active layer 11b due to the cleaning after the grinding when the first semiconductor substrate 11 of the laminated body 13 is ground, since approximately entire organic substance 14 is removed in the step of removing the organic substance, the native oxide film 15 does not remain to intersperse on the surface of the active layer 11b removing the native oxide film. Thus, it is possible to restrict the generation of the microprotrusions on the surface of the active layer 11b.

The invention according to claim 7 is a bonded substrate manufactured by the method recited in any one of the above claims 1 to 6.

In the bonded substrate recited in this claim 7, the generation of the microprotrusions and the cracked particles on its surface of the active layer 11b is restricted.

As described above, according to the present invention, since the organic substance adhering to the surface of the above active layer is removed before flattening the surface of the active layer by the vapor-phase etching and after forming a thin film from the first semiconductor substrate; and the native oxide film generated on the surface of the active layer is removed after removing the above organic substance, the organic substance does not become a mask during the removal of the native oxide film; thus, it is possible to remove the native oxide film on the surface of the active layer approximately fully. As a result of this, it is possible to flatten the surface of the active layer by the vapor-phase etching without generating the microprotrusions on the surface of the active layer.

Also, if the organic substance is removed by the cleaning using the dissolved ozone water or the sulfuric acid, or the treatment using the plasma or the radical of the oxygen gas, since the buried oxide film exposing on the peripheral surface of the substrate does not dissolve, the peripheral portion of the active layer in the vicinity of the peripheral surface of the substrate does not become like a shelter; thus, the cracked particles are not generated on the surface of the active layer.

Furthermore, if the native oxide film is removed by contacting it to the hydrogen fluoride aqueous solution having relatively low density, i.e., of 0.5 to 10% for relatively a short period, i.e., 0.5 to 10 minutes, the active layer exposed on the peripheral surface of the substrate does not dissolve by the hydrogen fluoride differently from a conventional high density hydrogen fluoride aqueous solution, i.e., having 50% density or higher, or a conventional long period treatment, i.e., for 30 minutes or longer; therefore, the peripheral portion of the active layer in the vicinity of the peripheral surface of the substrate does not become like a shelter; thus, the cracked particles are not generated on the surface of the active layer.

DETAILED DESCRIPTION OF THE PREFERRED EMBODIMENTS

Next, the best mode for carrying out the present invention is explained based on the drawings.

First Embodiment

Figure 1:
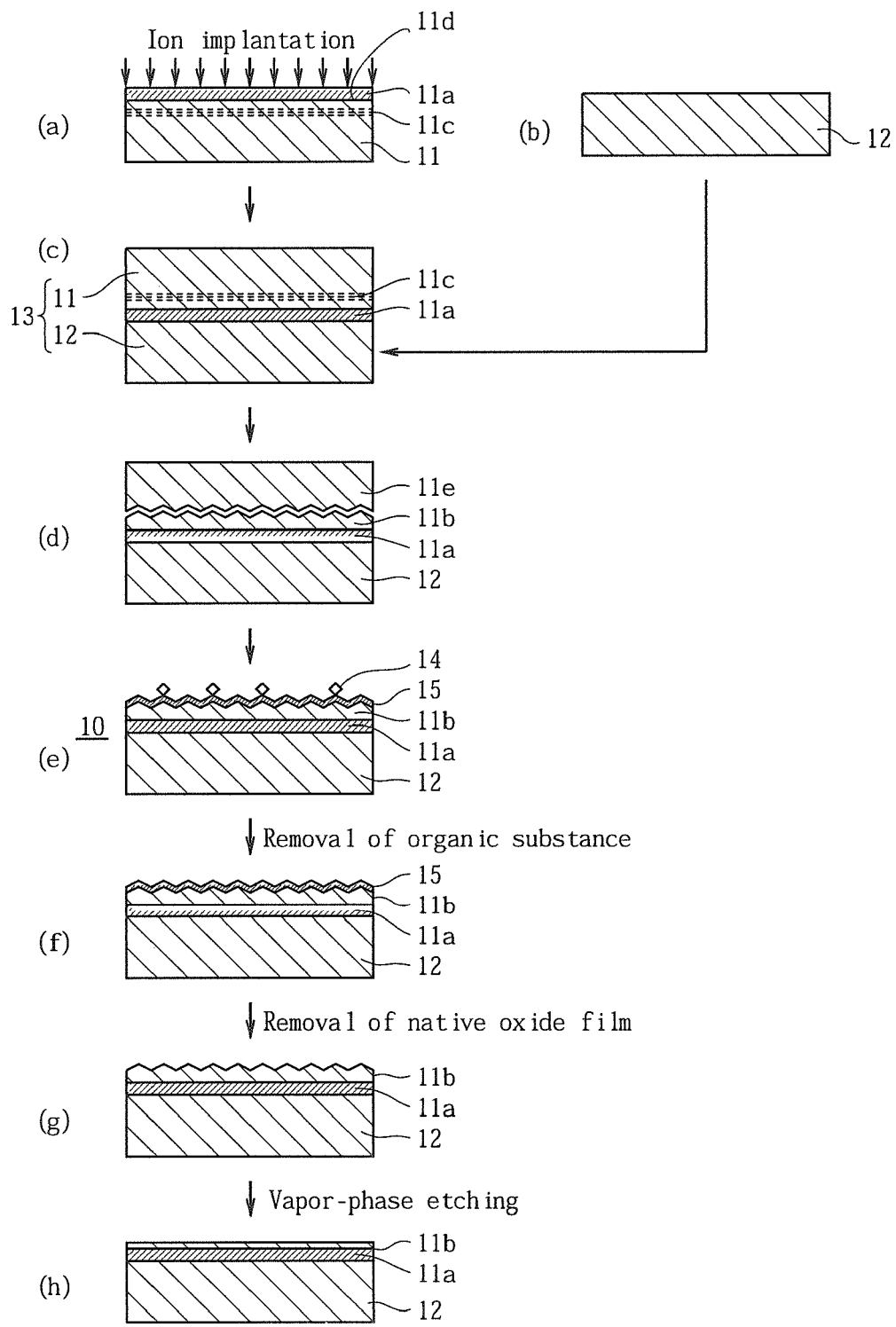
FIG. 1 is a diagram showing the method for manufacturing the bonded substrate using the ion implantation separation method of the first embodiment of the present invention in the order of the steps.

As shown in FIG. 1, the method according to the present invention for manufacturing the SOI substrate includes: an oxide file forming of forming an oxide film 11a on a surface of the first silicon substrate 11 serving as an SOI layer 11b; an ion implantation (FIGS. 1(a)) for forming an ion implantation area 11c in the first silicon substrate 11 by implanting ions into this first silicon substrate 11; a laminated body forming (FIG. 1(c)) for forming the laminated body 13 by overlapping the first silicon substrate 11 onto the second silicon substrate 12 serving as a support substrate; an SOI layer forming (FIGS. 1(d) and(e)) for separating the first silicon substrate 11 in the ion implantation area 11c and forming the SOI layer 11b formed by single crystal thin film on the second silicon substrate 12 via the oxide film 11a; removing an organic substance 14 adhering to the surface of the SOI layer 11b (FIG. 1(e) and (f)); removing the native oxide film 15 generated on the surface of the SOI layer 11b (FIG. 1(f) and(g)); and carrying out an etching treatment to the surface of the SOI layer 11b by the vapor-phase etching (FIGS. 1(g) and(h)).

The method configured in this manner for manufacturing the SOI substrate is explained.

A: Forming Oxide Film and Implanting Ions

The first silicon substrate 11 is manufactured by a Czochralski method. At first, an oxide film ($SiO_2$ film) 11a serving as an insulating film is formed on an entire surface of this substrate 11 by thermally oxidizing the first silicon substrate 11 formed by single crystal silicon at a high temperature of 900° C. or higher. The thickness of the above oxide film 11a is formed to be 50 to 300 nm; and preferably to be 100 to 200 nm. This is in order to annihilate voids in the bonded surface by flowing the oxide film 11a during the thermally bonding treatment at a high temperature. Here, the thickness of the oxide film 11a is limited in the range of 50 to 300 nm because the bonding yield decreases if it is less than 50 nm, the voids are hardly annihilated in the thermally bonding treatment at a high temperature; if it exceeds 300 nm, uniformity of the oxide film 11a is degraded less than the device requirement; and the necessary thickness (20 to 100 nm) of the SOI layer 11b cannot be obtained due to insufficient depth of the ion implantation via the oxide film 11a at an accelerating voltage of an ordinary ion implanting apparatus. From the first primary surface 11d side, ions are implanted into this first silicon substrate 11 on the entire surface of which the oxide film 11a is formed so that the dose amount of hydrogen molecule ion ($H_2^+$) is $2.5 \times 10^{16}/cm^2$ to $1.0 \times 10^{17}/cm^2$, or the dose amount of hydrogen ion ($H^+$) which is a hydrogen gas ion is $5.0 \times 10^{16}/cm^2$ to $2.0 \times 10^{17}/cm^2$, with an accelerating energy of 20 to 80 keV (FIG. 1(a)). Here, the dose amount of hydrogen gas ion ($H^+$) is limited to the range of $5.0 \times 10^{16}/cm^2$ to $2.0 \times 10^{17}/cm^2$ because if it is less than $5.0 \times 10^{16}/cm^2$, it is not possible to cleave, and if it exceeds $2.0 \times 10^{17}/cm^2$, spontaneous peeling occurs on the surface of the first silicon substrate 11 during the implantation of the hydrogen ion; thus the particles may be generated easily. Here, in the case of the hydrogen molecule ion ($H_2^+$), ½ of the dose amount in the case of the hydrogen gas ion ($H^+$) is necessary. Also, the accelerating energy is limited in the range of 20 to 80 keV because, if it is less than 20 keV, relatively large amount of the SOI layer 11b is removed in the step of removing the crystal defect layer of the surface of the SOI layer 11b by the vapor-phase etching and the flattening the surface of the SOI layer 11b; thus, the predetermined thickness of the SOI layer 11b cannot be obtained; and if it exceeds 80 keV, special ion implantation apparatus is necessary. This ion implantation area 11c is formed in parallel with the oxide film 11a in the first silicon substrate 11 by implanting the hydrogen molecule ions or the hydrogen gas ions, i.e., the ion implantation area 11c is formed in parallel with the first primary surface 11d. Also, the thickness of the above ion implantation area 11c is configured to be 200 to 1200 nm, preferably 500 to 700 nm. Here, the thickness of the ion implantation area 11c is limited to be 200 to 1200 nm because, if it is less than 200 nm, defects may occur easily after the thermal separation treatment, and if it exceeds 1200 nm, ions cannot be implanted more than 1200 nm in depth by an ordinary ion implantation. The oxide film 11a may be formed only on the surface of the first silicon substrate 11 by the CVD method in place of the thermally oxidization. Also, the oxide film may be formed on the second silicon substrate in place of the first silicon substrate.

B: Forming Laminated Body and Forming SOI Layer

The second silicon substrate 12 is prepared which is formed by a single crystal silicon having the same surface area as that of the above first silicon substrate 11 (FIG. 1(b)), after the both substrates 11 and 12 are cleaned by RCA method, the first silicon substance 11 is overlapped onto the second silicon substrate 12 via the oxide film 11a at a room temperature; thus, the laminated body 13 is formed (FIG. 1(c)). At this time, the overlapping is carried out so that the oxide film 11a in the first primary surface 11d side of the first silicon substrate 11 contacts the second silicon substrate 12.

The above laminated body 13 is put into a furnace and maintained there at a temperature of 450 to 800° C., preferably 500 to 700° C. for 1 to 30 minutes, preferably 10 to 30 minutes for carrying out the thermal separation treatment. Here, the thermal treatment is limited to a temperature at 450° C. or higher because if it is lower than 450° C., it cannot be separated in the ion implantation area 11c. Here, atmosphere in the furnace during the above thermal separation treatment is an inert gas atmosphere of $N_2$ (nitrogen) gas, Ar (argon) gas, etc. Thus, the first silicon substrate 11 for the active layer cracks at the ion implantation area 11c equivalent to a peak position of the hydrogen ion implantation; thus it is separated into the upper portion, i.e., a thick portion 11e and the lower portion, i.e., the SOI layer 11b (FIG. 1(d)). The lower portion, i.e., the SOI layer 11b becomes the SOI substrate 10 by contacting the second silicon substrate 12 via the oxide film 11a closely (FIG. 1(e)).

C: Removing Organic Substance

Next, the above SOI substrate 10 is cleaned by using dissolved ozone water or sulfuric acid, or the etching treatment is carried out to the SOI substrate 10 by using plasma or radical of oxygen gas; thus, the organic substance 14 adhering to the surface of the SOI layer 11b of the SOI substrate 10 is removed (FIGS. 1(e) and (f)).

In the cleaning using the dissolved ozone water, the SOI substrate 10 is dipped in the dissolved ozone water having density of 5 to 30 ppm, preferably 8 to 20 ppm for 1 to 10 minutes, preferably for 4 to 10 minutes. Here, the ozone density is limited to the range of 5 to 30 ppm because if it is less than 5 ppm, there is a deficiency that the organic substance 14 adhering to the surface of the SOI layer 11b cannot be fully removed, and if it exceeds 30 ppm, there is a deficiency that the density cannot be stable. Also, the dipping time is limited to approximately 1 to 10 minutes because if it is shorter than one minute, there is a deficiency that the organic substance 14 adhering to the surface of the SOI layer 11b cannot be fully removed, and if it exceeds ten minutes, there is no significant difference with respect to the removal effect and the cleaning cost increases.

In the cleaning using sulfuric acid and hydrogen peroxide, the SOI substrate 10 is dipped in the diluted sulfuric acid having sulfuric acid density of 60 to 90%, preferably 80% for 1 to 10 minutes, preferably for 5 to 10 minutes. Here, the density of the sulfuric acid is limited to the range of 60 to 90% because, if it is less than 60%, there is a deficiency that the organic substance 14 adhering to the surface of the SOI layer 11b cannot be fully removed, and if it exceeds 90%, the reaction between the sulfuric acid and hydrogen peroxide dampens; thus the organic substance 14 adhering to the surface of the SOI layer 11b cannot be fully removed. Also, the dipping time is limited to approximately 1 to 10 minutes because if it is shorter than one minute, there is a deficiency in that the organic substance 14 adhering to the surface of the SOI layer 11b cannot be fully removed, and if it exceeds ten minutes, there is no significant difference with respect to the removal effect and the cleaning cost increases.

In the etching treatment using the plasma of the oxygen gas, the organic substance 14 is incinerated by reacting the organic substance 14 with the plasma (reactive ion of oxygen) of the oxygen gas in the vapor-phase by an asher apparatus. This asher apparatus is configured to generate the plasma having low temperature and low ionization by flowing the oxygen gas at a pressure of 10 to 100 Pa into a cylindrical quartz-made reaction chamber; and applying 3 KW of high frequency voltage of 3 kw at 2.45 GHz. Also, the electrode structure of the asher apparatus is configured to dispose two pieces of electrode plates around a silica tube, or a coil-like electrode is wound around the quartz tube. The SOI substrate 10 is put under an electrically floating condition in the asher apparatus so that, although the ions in the plasma are accelerated and injected due to the difference between the plasma potential and the floating potential, this potential difference, several tens of Volts is small; therefore, the etching proceeds isotropically by the radical having mainly an arbitrary velocity component.

In the etching treatment using the radical of the oxygen gas, the etching treatment is carried out in the same manner as that using the above plasma of the oxygen gas except for disposing an aluminum-made etch tunnel in the above cylindrical quartz-made reaction chamber. By disposing the etch tunnel, the plasma is generated between external electrodes and the etch tunnel; and only neutral reactive radical passes through the above etch tunnel; thus the etching proceeds isotropically by reacting with the SOI substrate 10. In contrast to the above case of the etching using the plasma of the oxygen gas in which physical damage is imparted onto the surface of the SOI layer 11b by the reactive ion of the oxygen as a main etchant, the etching using the radical of the above oxygen gas is etching in a chemical reaction; therefore, there is an advantage in that the surface of the SOI layer 11b will not have a damage.

Furthermore, since the etching using the plasma or the radical of oxygen gas is a dry etching, it is possible to use vapor-phase etching in place of the asher apparatus.

D: Removing Native Oxide Film

After removing the organic substance 14 adhering onto the surface of the SOI layer 11b of the SOI substrate 10 for removing organic substance, the native oxide film 15 is removed which is formed by $SiO_2$ having approximately 1 nm thickness generated on the surface of the SOI layer 11b of the SOI substrate 10 by using hydrofluoric acid (FIGS. 1(f) and (g)). The SOI substrate 10 is dipped in the hydrofluoric acid aqueous solution having the density of 0.5 to 10%, preferably 1 to 5% for 0.5 to 10 minutes, preferably for 0.5 to 5 minutes; thus the SOI substrate 10 is cleaned. The density of the hydrogen fluoride is limited to the range of 0.5 to 10% because, if it is less than 0.5%, there is a deficiency that the native oxide film 15 generated on the surface of the SOI layer 11b cannot be fully removed, and if it exceeds 10%, the oxide film 11a exposed around the SOI substrate 10 is dissolved; thus the peripheral portion of the SOI layer 11b becomes like a shelter and cracked particles are generated on the surface of the SOI layer 11b in the following steps such as thermal treatments. Also, the treatment time is limited in the range of 0.5 to 10 minutes because if it is less than 0.5 minutes, there is a deficiency that the native oxide film generated on the surface of the SOI layer 11b cannot be fully removed, and if it exceeds 10 minutes, the cracked particles are generated as in the case that the density of the hydrogen fluoride exceeds 10%. Furthermore, aqueous solution including hydrofluoric acid and organic acid may be used for removing the native oxide film. This aqueous solution can remove metal impurities and fine particles having particle diameter of 1 μm or less adhering to the surface of the SOI substrate during manufacturing the SOI substrate; thus, it is possible to obtain an effect of preventing them from adhering to the surface of the SOI substrate again. As organic acid, one or more than two sorts of organic acid selected from a group consisting of citric acid, succinic acid, ethylenediaminetetraacetic acid, tartaric acid, salicylic acid, oxalic acid and acetic acid or formic acid can be named.

E: Vapor-Phase Etching Treatment

After the native oxide film 15 generated on the surface of the SOI layer 11b of the SOI substrate 10 is removed by the above hydrofluoric acid cleaning treatment, the surface of the SOI layer 11b is flattened by the vapor-phase etching (FIGS. 1(g) and (h)). By this vapor-phase etching, the removal of the crystal defect layer of the SOI layer 11b generated by the ion implantation separation of the SOI substrate 10; the uniforming of the in-plane film thickness of the SOI layer 11b; and the forming of a thin film from the SOI layer 11b to a predetermined thickness are carried out simultaneously. For the above vapor-phase etching, it is preferable to use reactive gas of $SF_6$, because the reactive gas of $SF_6$ has significant vaporization pressure in the vicinity of a room temperature for compounds with Si as a material-to-be-etched; having significant Si etching ratio; being ordinarily more obtainable due to its production amount and its cheap price than those of other gases; and containing F as halogen element; and being corrosive gas. For vapor-phase etching methods (plasma etching method) using the $SF_6$ reactive gas, there are DCP (Dry Chemical Planarization) method, etc. in which: together with introducing the $SF_6$ etching gas into an emission tube; introducing microwave of 2.45 GHz generated by a microwave generating apparatus to the above emission tube through a waveguide pipe; plasmatizing the above etching gas by the microwave; generating reactive ion and reactive radical; and carrying out local etching of the surface of the SOI layer 11b by injecting the reactive ion and the reactive radical as etchant from injection nozzles.

In a case of carrying out the vapor-phase etching treatment by reactive plasma using $SF_6$ as an etching gas, if $SF_6$ is decomposed and activated by the microwave, as shown in next reaction formula (1), there is generated a reactive radical which is composed of reactive ions composed of $SF_x$, $F^-$ (fluorine ion), etc., and there is generated a reactive radical which is composed of only neutral radical $F^*$.

$$SF_6 \rightarrow SF_x + F^- + F^* + \ldots \quad (1)$$

If the reactive ion and the reactive radical are injected to a predetermined portion of the surface of the SOI layer 11b locally, the etching as shown in the following reaction formula (2) is carried out.

$$2Si + 4SF_x + 4F^- + 4F^* + \ldots \rightarrow 2SiF_4 + 4SF_x + \ldots \quad (2)$$

Also, in a case of carrying out the vapor-phase etching treatment by the reactive radical using $SF_6$ as an etching gas, if $SF_6$ is decomposed and activated by the microwave, as shown in the above reaction formula (1), there is generated a reactive ion which is composed of reactive ions composed of $SF_x$, $F^-$ (fluorine ion), etc., and there is generated a reactive radical which is composed of only neutral radical $F^*$.

In order to separate the reactive ion from the reactive radical and inject only the reactive radical separately from the injection nozzles, the area where plasma is generated by the microwave is separated to upstream side from a tip of the injection nozzles by utilizing the property of the reactive ion which cannot exist in a long distance against the reactive radical. Thus it is possible to inject only the reactive radical.

If the reactive radical of the reactive ion and the reactive radical alone is injected to a predetermined portion of the surface of the SOI layer 11b locally, the etching as shown in the following reaction formula (3) is carried out. The $SiF_4$ (silicon tetrafluoride) is a gas at a room temperature.

$$F^* + 4Si \rightarrow SiF_4 \uparrow \ldots \quad (3)$$

By etching the surface of the SOI layer 11b in accordance with variance of the in-plane film thickness in the entire SOI layer 11b by using the plasma or the radical of the reactive gas of $SF_6$ generated by the above vapor-phase etching method, it is possible to remove the crystal defect layer of a cleavage surface, i.e., the surface of the SOI layer 11b at the ion implantation area 11c by the thermal treatment; it is possible to flatten the surface of the SOI layer 11b; it is possible to uniform the in-plane film thickness of the SOI layer 11b by reducing variance of the in-plane film thickness of the SOI layer 11b; and furthermore, it is possible to form a thin film to the predetermined film thickness. While the vapor-phase etching treatment by the plasma of the reactive gas using reactive ion of $SF_6$ as a main etchant may impart physical damage to the surface of the SOI layer 11b by the reactive ion of $SF_6$, the vapor-phase etching treatment by the radical of the reactive gas using only the reactive radical of $SF_6$ as an etchant is an etching of chemical reaction; therefore, it does not impart damage to the surface of the SOI layer 11b.

Here, in this embodiment, the plasma or the radical of the reactive gas of $SF_6$ is used for flattening the surface of the SOI layer, but plasma or radical of reactive gas of $CF_4$, plasma of mixture gas of Ar and $H_2$, plasma of mixture gas of $CF_4$ and $O_2$, and plasma of singular gas of $O_2$, etc. may also be used for it. In this case, as in the above case, the etching is carried out by utilizing the physical energy, after the various gases are ionized, by accelerating them in electric field and injecting them from the injection nozzles so as to collide them onto the surface of the SOI layer 11b.

In the present specification, the phrase "entire SOI layer 11b" in the phrase "variance of the in-plane film thickness in the entire SOI layer 11b" indicates a portion except for chamfered portion around a peripheral marginal of the SOI layer 11b.

Furthermore, in order to improve uniformity of the in-plane film thickness of the SOI layer after the vapor-phase etching, the thickness of the SOI layer may be measured before the vapor-phase etching; and the local vapor-phase etching may be scanned on the entire surface of the SOI layer 11b so that an etching amount of a thick layer portion is significant and an etching amount of thin layer portion is insignificant.

Second Embodiment

Figure 2:
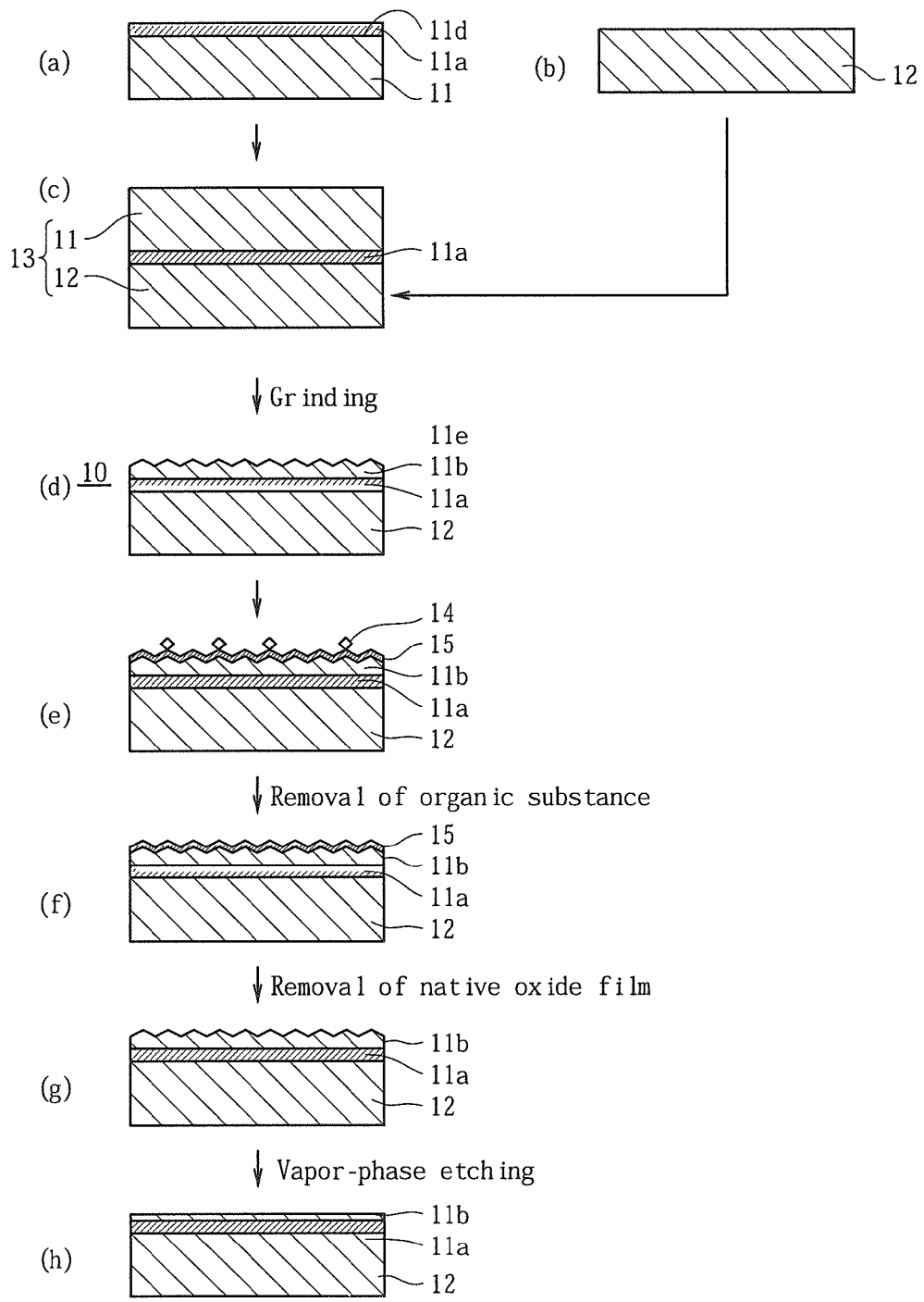
FIG. 2 is a diagram showing the method for manufacturing the bonded substrate using the GB method of the second embodiment of the present invention in the order of the steps.
Figure 3:
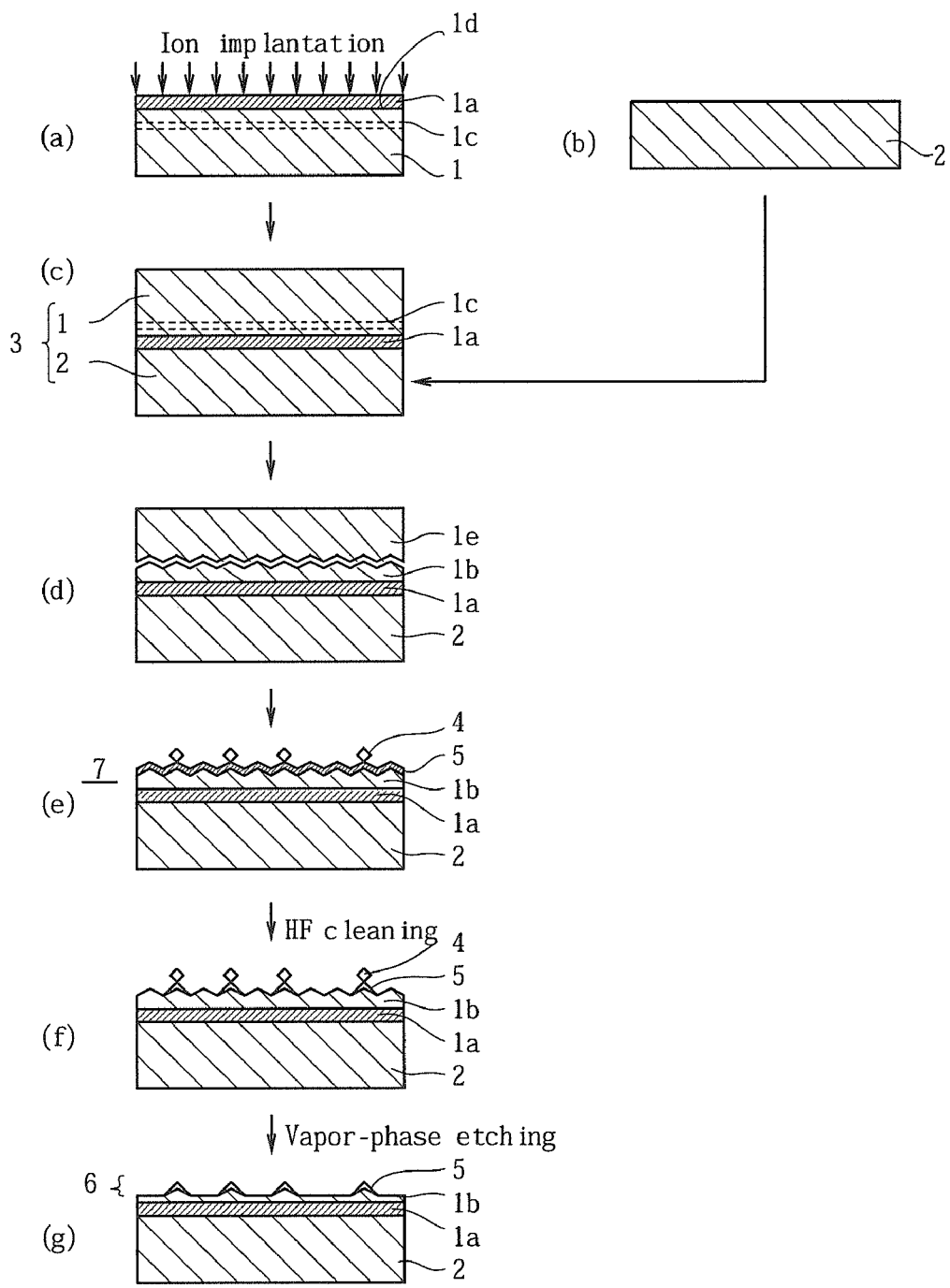
FIG. 3 is a diagram showing the conventional examples corresponding to FIG. 1.
Figure 4:
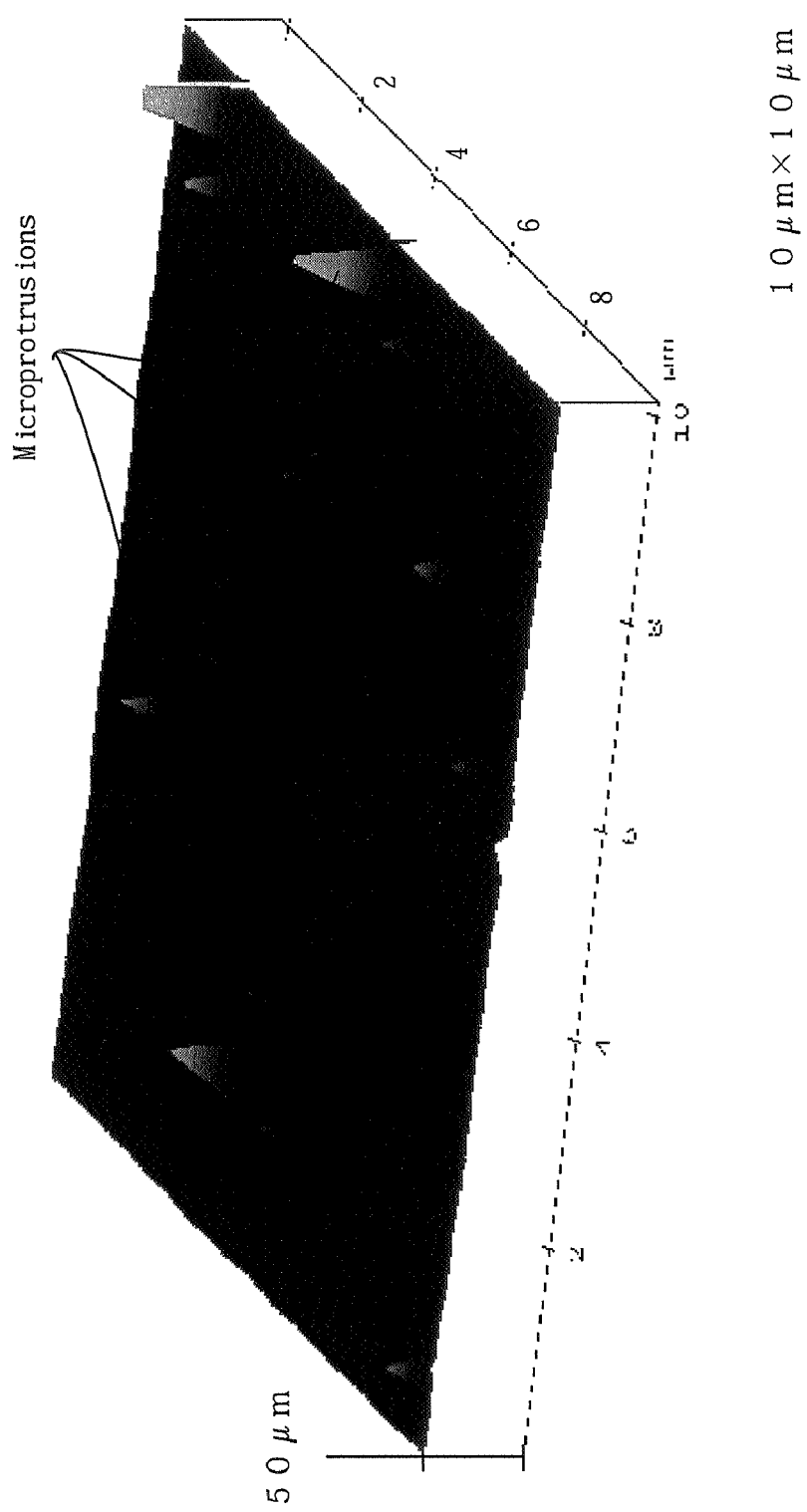
FIG. 4 is a photographic diagram showing the conventional example captured by the atomic force microscope.

FIG. 2 shows a configuration of the second embodiment of the present invention. In FIG. 2, the same reference numerals indicate the same parts as those shown in FIG. 1.

In this embodiment, the ion implantation area is not formed on the first silicon substrate 11; the first and second silicon substrates 11, 12 are laminated via the oxide film 11a; a thermally bonding treatment is carried out to this laminated body 13; and after that, a thin film of SOI layer 11b is formed by grinding the first silicon substrate 11. That is, the SOI substrate 10 is manufactured by the GB method. Specifically, in the step of forming the laminated body, the first silicon substrate 11 is overlapped on the second silicon substrate 12 via the oxide film 11a at a room temperature so as to form the laminated body 13 (FIG. 2(c)); the laminated body 13 is put into a furnace in the thermally bonding treatment; it is maintained in a nitrogen atmosphere or an oxygen atmosphere at a temperature of 1000 to 1300° C., preferably 1100 to 1200° C. for 1 to 3 hours, preferably 1 to 2 hours so as to bond them. Here, the temperature of the thermal treatment is limited to the range of 1000 to 1300° C. because, if it is less than 1000° C., the adherence between bonded surfaces is not sufficient, and if it exceeds 1300° C., slip transition occurs. Furthermore, the atmosphere in the furnace during the above thermal treatment is an inert gas atmosphere of nitrogen gas, and argon gas, etc. Furthermore, in the step of forming the SOI layer, the first silicon substrate 11 is ground; thus, the SOI substrate 10 having thin film of the SOI layer 11b is obtained (FIG. 2(d)). In the step of removing the organic substance (FIGS. 2(e) and (f)), the removing the native oxide film (FIGS. 2(f) and (g)), and the vapor-phase etching treatment (FIGS. 2(g) and (h)) are configured to be the same as those of the configuration of the first embodiment.

Furthermore, although silicon is named as a semiconductor in the first and the second embodiments, it can be applied to semiconductors such as SiGe, SiC, and Ge.

Also, although the first semiconductor substrate is overlapped onto the second semiconductor substrate via the oxide film in the above first and second embodiments, it may be applied to a case in which the first and the second semiconductor substrates are overlapped directly without the oxide film.

EXAMPLES

Next, examples of the present invention are explained specifically with comparative example.

Example 1

As shown in FIG. 1, a first silicon substrate 11 and a second silicon substrate 12 were prepared respectively both of which were formed by P-type silicon wafers in which electric resistance ratio is 1 to 10 Ωcm, and oxygen density is 10 to 14×10$^{17}$ atoms/cm$^3$ (former ASTM, hereinafter the same). Next, the thermal treatment was carried out in which the first silicon substrate 11 was maintained in a dry oxygen atmosphere at a temperature of 1050° C. for four hours; thus, 150 nm (1500 Å) of an oxide film 11a was formed on an entire surface (whole surface) of the first silicon substrate 11. After that, hydrogen gas ion (H$^+$) was ion-implanted into the first primary surface 11d of the first silicon substrate 11 at an implantation energy of 50 kev with a dose amount of 6×10$^{16}$/cm$^2$, thus, the ion implantation area 11c was formed inside of the first silicon substrate 11 (FIG. 1(a)). Next, after the RCA cleaning was carried out to the first silicon substrate 11 and the second silicon substrate 12, the laminated body 13 was formed (FIG. 1(c)) by overlapping the first silicon substrate 11 onto the second silicon substrate 12 so that the oxide film 11a of the first silicon substrate 11 on the side of the first primary surface 11d contacted the second silicon substrate 12 closely.

The laminated body 13 was separated in the ion implantation area 11c (FIG. 1(d)) by containing the laminated body 13 in the thermal treatment furnace; increasing the temperature of the nitrogen gas atmosphere to 500° C. in the furnace; and maintaining the temperature for 30 minutes. This enabled the SOI substrate 10 to be obtained which was formed by the second silicon substrate 12 on which the SOI layer 11b is laminated via the oxide film 11a. Then, after the organic substance 14 is removed by dipping this SOI substrate 10 in the dissolved ozone water having 20 ppm density for 10 minutes (FIG. 1(e) and (f)), the native oxide film 15 was removed by dipping this SOI substrate 10 in the hydrofluoric acid aqueous solution having 5% density for 5 minutes (FIGS. 1(f) and (g)), furthermore, the vapor-phase etching treatment was carried out to the SOI substrate 10 for 3 minutes by using only radical of the reactive gas of CF$_4$ selectively. This SOI substrate 10 is referred to as the example 1.

Example 2

Except that the organic substance was removed by dipping it in the diluted sulfuric acid having 80% density for 10 minutes in place of dissolved ozone water, the SOI substrate was obtained as in the example 1. This SOI substrate is referred to as the example 2.

Example 3

Except that the organic substance was removed by carrying out the etching treatment for 3 minutes by the plasma of oxygen gas generated by the plasma etching method using the asher apparatus in place of the dissolved ozone water, the SOI substrate was obtained as in the example 1. This SOI substrate is referred to as the example 3.

Example 4

Except that the organic substance was removed by carrying out the etching treatment for 3 minutes by using only the radical of the oxygen gas selectively generated by the plasma etching method using the asher apparatus in place of the dissolved ozone water, the SOI substrate was obtained as in the example 1. This SOI substrate is referred to as the example 4.

Comparative Example 1

The SOI substrate was obtained as in the example 1 except that the cleaning for the organic substance by the dissolved ozone water was not carried out. This SOI substrate is referred to as the comparative example 1.

Comparison Test and Evaluation

Scopes at ten points surrounded by 10 μm×10 μm on the surface of the SOI substrates according to Examples 1 to 4 and the Comparative Example 1 were observed respectively by using the Atomic Force Microscope with which rows of atoms on a surface of a substance were observed by utilizing atomic force; and the number of microprotrusions generated on these portions was counted. The result is shown in TABLE 1. Here, the density of the microprotrusions in the TABLE 1 is converted to the density per 1 cm².

TABLE 1

|  | Removing organic substance | Removing native oxide film | Density of microprotrusions (1/cm²) |
|---|---|---|---|
| Example 1 | Cleaning by dissolved ozone water | Cleaning by hydrofluoric acid | $5 \times 10^5$ |
| Example 2 | Cleaning by sulfuric acid | Cleaning by hydrofluoric acid | $5 \times 10^5$ |
| Example 3 | Oxygen gas reactive plasma etching | Cleaning by hydrofluoric acid | $2 \times 10^5$ |
| Example 4 | Oxygen gas reactive radical etching | Cleaning by hydrofluoric acid | $<1 \times 10^5$ |
| Comparative example 1 | None | Cleaning by hydrofluoric acid | $1 \times 10^6$ to $1 \times 10^7$ |

As apparently from the TABLE 1, it is found out that while the density of the microprotrusions is $1\times10^6$ to $1\times10^7$/cm² in the comparative example 1 in which only the treatment for removing native oxide film is carried out before the vapor-phase etching treatment for flattening the surface of the SOI layer, the density of the microprotrusions is restricted to be $5\times10^5$/cm² or smaller in the examples 1 to 4 in which the treatment for removing organic substance and the treatment for removing the native oxide film are conducted before the vapor-phase etching treatment for flattening the surface of the SOI layer.

What is claimed is:

1. A method for manufacturing a bonded substrate comprising in forming a laminated body by overlapping a first semiconductor substrate to serve as an active layer onto a second semiconductor substrate to serve as a support substrate with or without an oxide film an oxide film therebetween;
    forming the active layer by forming a thin film from the first semiconductor substrate;
    further flattening the surface of the active layer by vapor-phase etching,
    the method further comprising removing any organic substance adhering to the surface of the active layer to generate a native oxide film on the surface of the active layer after forming the thin film from the first semiconductor substrate and before flattening the surface of the active layer by vapor-phase etching,
    removing the native oxide film generated on the surface of the active layer after removing the organic substance.

2. The method according to claim 1, wherein the removal of the organic substance is carried out by cleaning using a dissolved ozone water or sulfuric acid.

3. The method of claim 1 wherein the removal of the organic substance is carried out by a treatment using plasma of oxygen gas or an oxygen radical.

4. The method of claim 1 wherein the removal of the native oxide film is carried out by cleaning by contacting the surface of the active layer with a hydrofluoric acid aqueous solution having a density of 0.5 to 10% for 0.5 for 10 minutes.

5. The method according to claim 1, wherein the flattening of the surface of the active layer by the vapor-phase etching is carried out by using a plasma or radical of a reactive gas selected from the group consisting of $SF_6$, $CF_4$, a plasma of a mixture of Ar and $H_2$, a mixture of $CF_4$ and $O_2$, and $O_2$ alone.

6. The method according to claim 1, which further comprises implanting ions into the first semiconductor substrate on which the oxide film is formed to form an ion implantation area therein, forming a thin film from the first semiconductor substrate by forming a laminated body by overlapping the first semiconductor substrate onto the second semiconductor substrate via the oxide film to form the active layer ; and separating the laminated body in the ion implantation area.

7. The method according to claim 1, wherein, after forming the laminated body thermally treating the laminated body to bond it forming the active layer by forming a thin film from the first semiconductor substrate by grinding the first semiconductor substrate to a predetermined thickness.

8. A bonded substrate manufactured by the method according to claim 1.

9. A bonded substrate manufactured by the method of claim 2.

10. A bonded substrate manufactured by the method of claim 3.

11. A bonded substrate manufactured by the method of claim 4.

12. A bonded substrate manufactured by the method of claim 5.

13. A bonded substrate manufactured by the method of claim 6.

* * * * *